(12) United States Patent
Gieseler et al.

(10) Patent No.: US 7,602,251 B2
(45) Date of Patent: Oct. 13, 2009

(54) ARRANGEMENT FOR CARRYING OUT CURRENT-TO-VOLTAGE CONVERSION

(75) Inventors: Michael Gieseler, Dresden (DE); Manfred Sorst, Radebeul (DE)

(73) Assignee: Zentrum Mikroelektronik Dresden AG, Dresden (DE)

( * ) Notice: Subject to any disclaimer, the term of this patent is extended or adjusted under 35 U.S.C. 154(b) by 0 days.

(21) Appl. No.: 11/994,121

(22) PCT Filed: Jun. 28, 2006

(86) PCT No.: PCT/DE2006/001109

§ 371 (c)(1),
(2), (4) Date: Mar. 11, 2008

(87) PCT Pub. No.: WO2007/000154

PCT Pub. Date: Jan. 4, 2007

(65) Prior Publication Data

US 2008/0197920 A1 Aug. 21, 2008

(30) Foreign Application Priority Data

Jun. 28, 2005 (DE) ........................ 10 2005 030 475

(51) Int. Cl.
*H03F 3/08* (2006.01)

(52) U.S. Cl. ........................................ 330/308

(58) Field of Classification Search .................. 330/98, 330/99, 100, 308; 250/214 A, 214 AG
See application file for complete search history.

(56) References Cited

U.S. PATENT DOCUMENTS

| 5,343,160 | A | 8/1994 | Taylor |
| 6,462,327 | B1 | 10/2002 | Ezell et al. |
| 6,552,605 | B1 | 4/2003 | Yoon |
| 7,231,152 | B2 * | 6/2007 | Kim et al. .................. 398/208 |
| 2003/0197563 | A1 * | 10/2003 | Nishizono .................. 330/308 |
| 2004/0129862 | A1 | 7/2004 | McTaggart |

FOREIGN PATENT DOCUMENTS

WO 2005/046094 A 5/2005

OTHER PUBLICATIONS

International Search report dated Oct. 27, 2006.

* cited by examiner

*Primary Examiner*—Steven J Mottola
(74) *Attorney, Agent, or Firm*—Heslin Rothenberg Farley & Mesiti P.C.

(57) ABSTRACT

An arrangement is provided for carrying out current-to-voltage conversion, preferably for an infrared receiver, in which the static offset, which has an interfering effect with regard to sensitivity or malfunctions, is reduced during the carrying out of current-to-voltage conversion of received input pulses. In this arrangement, outputs of a second stage are fed back to inputs of a first stage of the multistage transimpedance stage.

3 Claims, 3 Drawing Sheets

ARRANGEMENT FOR CARRYING OUT CURRENT-TO-VOLTAGE CONVERSION

CROSS REFERENCE TO RELATED APPLICATIONS

This application is a national stage filing under section 371 of International Application No. PCT/DE2006/001109, filed on Jun. 28, 2006, and published in German on Jan. 4, 2007 as WO 2007/000154 A1 and claims priority of German application No. 10 2005 030 475.3 filed on Jun. 28, 2005, the entire disclosure of these applications being hereby incorporated herein by reference.

BACKGROUND ART

The invention relates to a configuration for carrying out a current-to-voltage conversion, preferably for an infrared receiver. This configuration comprises a transimpedance stage, which contains a multistage amplifier and which exhibits two inputs with first coupling capacitances, which are connected between the photodiode and the inputs of the transimpedance stage, and two outputs. The outputs of the transimpedance stage are connected to the inputs of a configuration for gain control; and the output of the configuration for the gain control is connected to the gain control input of the transimpedance stage. The outputs of the transimpedance stage are connected to an associated input of a comparator.

The further development and, above all, the advancing miniaturization, for example, of IrDA modules (infrared data association) has resulted in increasingly more stringent demands on the IrDA transceiver chips, which are integrated in said IrDA modules, as well as the transmit-receive diodes. Hence, this trend demands higher sensitivities, smaller chip areas and less operating current and/or decreasing operating voltages.

Owing to the manufacturing tolerances in the production process all of the symmetrical circuit parts of both amplifier stages and the transimpedance resistors are asymmetrical. Consequently, despite an input voltage $U_e$ of $U_e=0V$ at the input stage, an output voltage $U_a \neq 0V$ is produced. This output voltage, which is referred to as the static offset, may vary in magnitude from chip to chip and may be positive or negative. Since the receivers comprise, according to the prior art, two stages (a first stage, which is wired as the transimpedance amplifier stage, and a second stage, which is wired as the voltage amplifier), the static offset, which is produced by the first stage, is amplified even more by the second stage, which is downstream of the first stage. This offset interferes with the generation of a pulse-accurate signal by a comparator, following the transimpedance stage.

The prior art discloses a plurality of methods for compensating the static offset.

A first method consists of measuring the static offset and compensating this static offset in accordance with the chopper principle while the device is running. The drawbacks of this method lie in the necessity of an active additional circuit for measuring and compensating, a large load capacitor, a higher current and area requirement owing to this configuration as well as potential noise emissions by the clock generator of the additional circuit. The offset has to be measured and compensated during the pulse or transmission breaks. Therefore, this method is inappropriate for a continuous-time input signal, because, for example, in the case of an infrared receiver it is not known at what point in time the light pulses will arrive.

A second method consists of separating the static offset by means of the coupling capacitances. These coupling capacitances are inserted between the outputs of the transimpedance stage and the inputs of a downstream comparator. Since a low low-frequency offset is necessary for a signal transmission that is a true reproduction of the original, the coupling capacitors must be dimensioned so as to match in size. Therefore, the drawback with this solution lies in the higher area requirement for the coupling capacitors. Another drawback lies in the generation of additional pole positions in the transmission function of the entire configuration by means of the coupling capacitances in interaction with the other circuit components. Thus, extensive measures for realizing a standardized transmission in accordance with the IrDA protocol are necessary, because no other pulses, besides the pluses of the input pattern, may be generated by the intrinsic dynamics of the configuration.

A third possibility consists of calibrating the transimpedance stage during the production process. In order to carry out this calibration, the chip must have additional elements that can be calibrated and that exhibit a suitable circuitry. Then these additional elements are balanced, for example, with a laser. This process usually consists of a plurality of calibration and measuring operations, which must be repeated, before the chip is balanced. Therefore, the drawbacks with this solution lie in the higher space requirement owing to the additional elements and the time-consuming and complicated calibration.

Owing to the above described drawbacks these compensation operations are unsuitable for small, economical chips, which are used for differentiating protocols, such as the specifications SIR (serial infrared) or MIR (medium infrared).

BRIEF SUMMARY OF INVENTION

Therefore, the invention is based on the problem of providing a configuration for carrying out a current-to-voltage conversion, preferably for an infrared receiver, with which the static offset, which has an interfering effect with regard to sensitivity or malfunctions, is reduced while carrying out the current-to-voltage conversion for the received input pulses. Therefore, all of the offset compensation measures in the amplifier itself or at its output can be dispensed with.

The invention solves this problem with a configuration for carrying out the current-to-voltage conversion of the type that is described in the introductory part. According to the invention, the outputs of a multistage amplifier are fed back via the transimpedance resistor to its inputs in such a manner that the static offset of the multistage amplifier is transformed at the amplifier output only by a gain factor of 1. The invention uses a multistage amplifier having two stages.

Whereas in the prior art each substage of a multistage amplifier configuration has its own feedback path, the invention provides only one feedback path by means of the transimpedance resistor via both stages of the amplifier. Said amplifier is designed in such a manner that the elements of the feedback are arranged between a first output ("outn") of the second stage and a first input ("inp") of the first stage as well as between a second output ("outp") of the second stage and a second input ("inn") of the first stage of the multistage amplifier.

Thus, the current-to-voltage conversion is carried out over both stages of the transimpedance stage, which is populated with a multistage amplifier configuration.

The aim of this type of feedback is to achieve that through the use of a transimpedance in the feedback of the multistage amplifier configuration the static offset of the whole amplifier is transformed at the output of the transimpedance stage only by a gain factor of "one".

The magnitude of the remaining static offset is so low, for example, owing to the use of bipolar transistors in the two differential stages that it disappears in the tolerance of the comparator switching threshold of a downstream comparator.

One embodiment of the invention provides that the outputs of the transimpedance stage are connected directly to the inputs of the downstream comparator.

In the prior art the outputs of the transimpedance stage are coupled to the inputs of a downstream comparator by way of the coupling capacitances. Since in the inventive solution the static offset is very small, the outputs of the transimpedance stage are connected directly to the inputs of the comparator. Thus, on the one hand, the chip area that is required for the coupling capacitors is reduced; and, on the other hand, an additional pole position in the transmission function of the configuration for carrying out the current-to-voltage conversion is avoided.

Another embodiment of the invention provides that a stage, which limits the output signal to a threshold value, is arranged between the outputs of the transimpedance stage.

In order to ensure an error-free and pulse-accurate signal processing by a comparator, which is connected downstream of the transimpedance stage, it is advantageous to limit the output voltage and, thus, the comparator input voltage in the signal amplitude of the differential output signal, for example, to a voltage value of $U \leq 400$ mV.

BRIEF DESCRIPTION OF THE DRAWING FIGURES

The invention is explained in detail below with reference to two embodiments. Therefore, in the associated drawings FIG. 1 is an overview of an IrDA receiver, according to the prior art.

DETAILED DESCRIPTION

Figure 1:
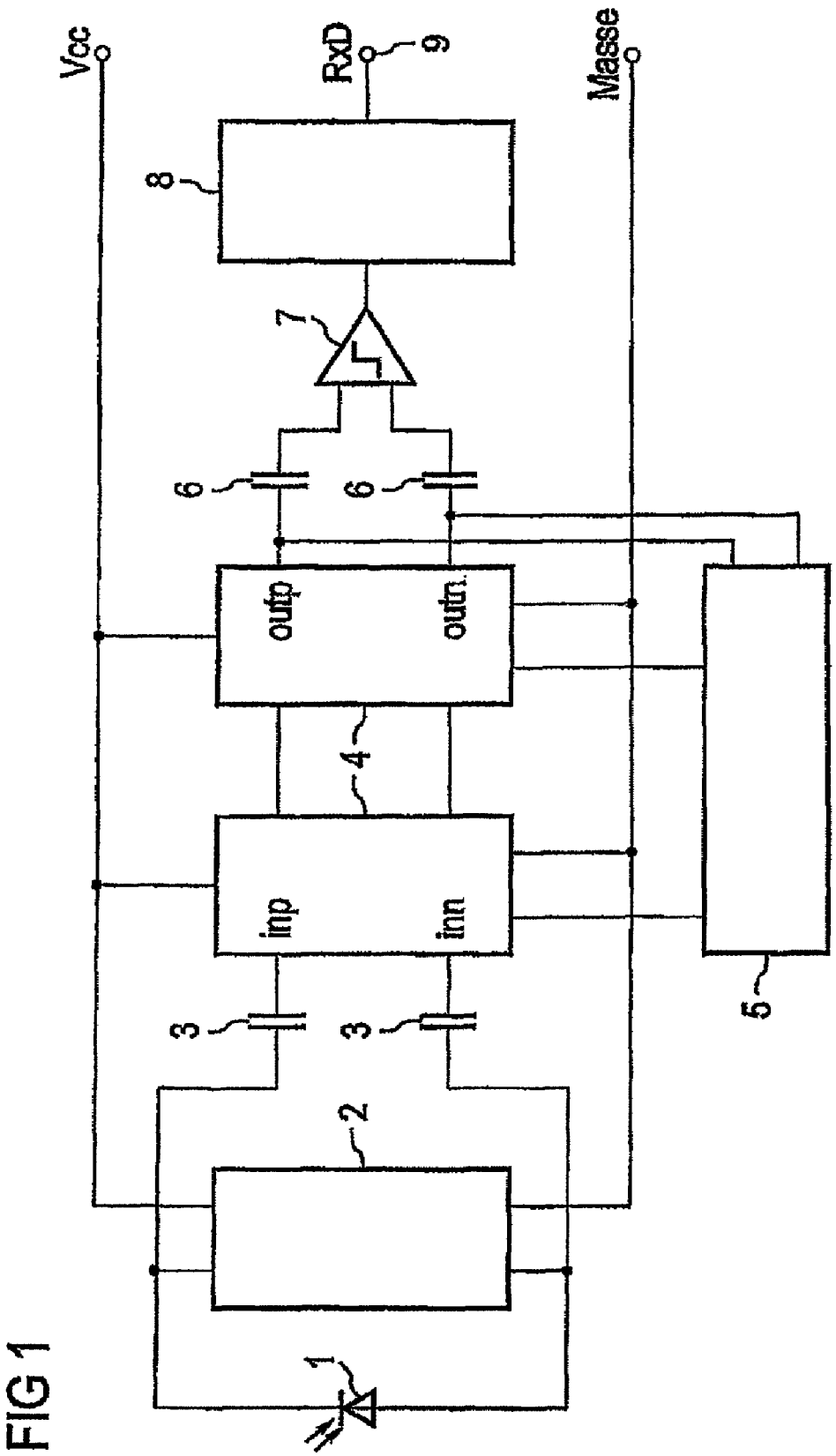

FIG. 1 depicts a circuit configuration in accordance with the prior art. This circuit configuration consists of a photodiode 1, which is wired to a bias generation 2 and which is connected to a multistage transimpedance stage 4 by way of the first coupling capacitances 3. The outputs of the multistage transimpedance stage 4 are connected to the inputs of an automatic gain control 5. The output of the automatic gain control 5 is connected to the gain control input of the multistage transimpedance stage 4 in order to control the gain of the stage. Furthermore, the outputs of the multistage transimpedance stage 4 are connected to the inputs of a comparator 7 by way of the second coupling capacitances 6. In order to condition the comparator output signal for a subsequent processing, a digital aftertreatment stage 8 may be connected downstream of the comparator 7. Then said digital aftertreatment stage provides the output signal of the IrDA receiver at the output RxD 9.

Figure 2:
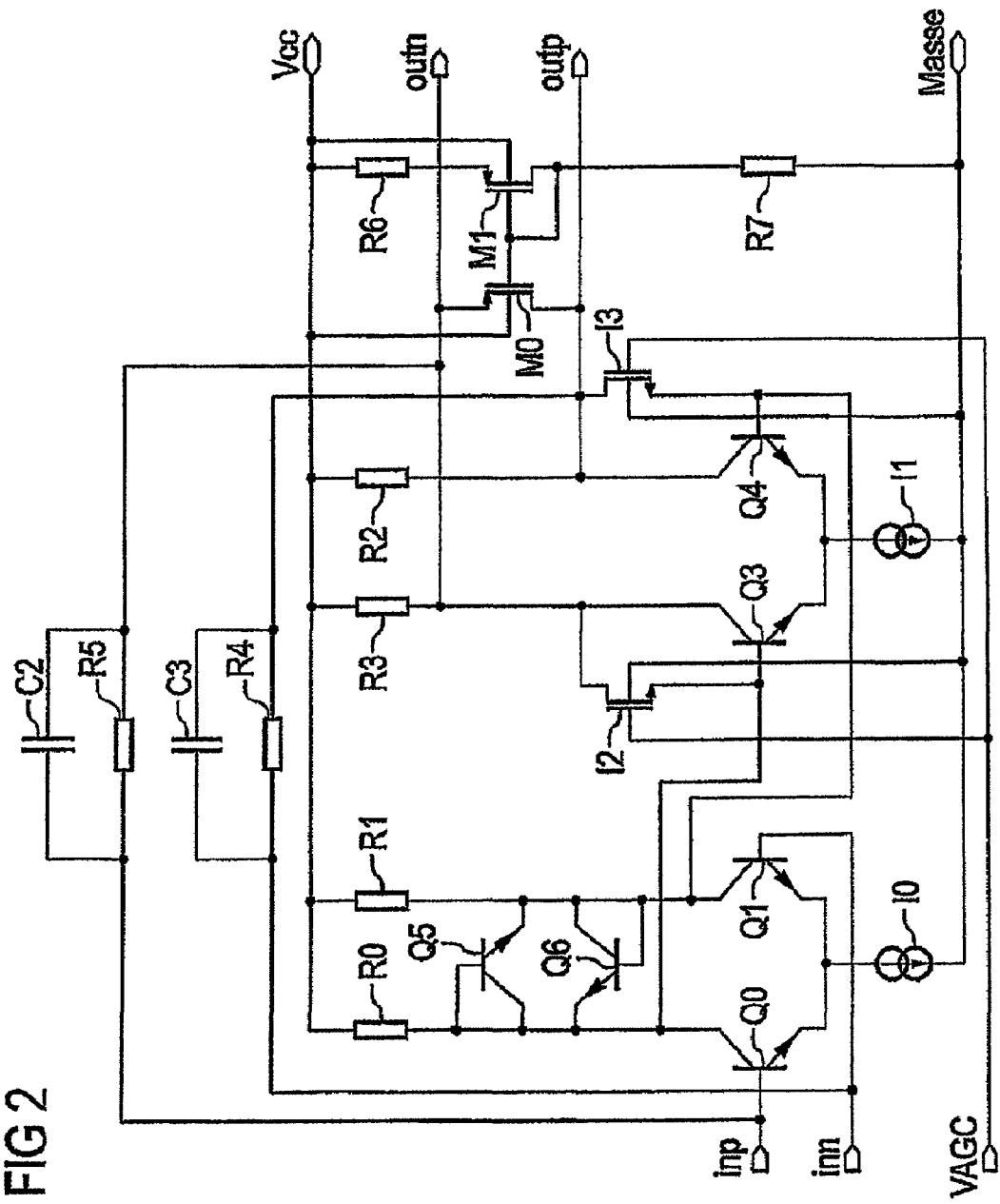
FIG. 2 depicts a transimpedance stage, according to the invention.

FIG. 2 depicts a practical implementation of an inventive configuration for carrying out the current-to-voltage conversion in an IrDA receiver. This drawing depicts the two stage transimpedance stage with feedback over both stages.

The configuration exhibits not only two inputs "inp" and "inn", the two outputs "outn" and "outp", a connector for an operating voltage "Vcc", but also a connector for the ground potential and a gain control input "V_AGC".

The inputs of the transimpedance stage "inp" and "inn" are connected respectively to a base terminal of the bipolar input differential amplifier, which consists of the transistors Q0 and Q1 and represents the first stage of the multistage transimpedance stage. The collectors of the transistors Q0 and Q1 are connected to the operating voltage "Vcc" by way of the resistors R0 and R1. The emitters of the transistors Q0 and Q1 are connected jointly to the current source I0, where the second terminal of the current source I0 is connected to the ground potential.

In order to enhance the large signal strength of the first stage, the transistors Q5 and Q6, which are connected as the diodes and by means of which a differential signal limit is realized, are arranged between the collectors of the transistors Q0 and Q1. This limit is necessary, for example, in the event that an infrared transmitter sends out its light pulses in the immediate vicinity of the receiver diode, thus generating a large photo current in the receiver diode.

The outputs of the bipolar input differential amplifier of the first stage, which is connected to the collectors of the transistors Q0 and Q1, are connected to the base terminals of the transistors Q3 and Q4 of the downstream, controlled differential amplifier configuration, which represents the second stage of the multistage amplifier configuration, which is used as the transimpedance stage.

The collectors of the transistors Q3 and Q4 are connected to the operating voltage "Vcc" by way of the resistors R3 and R2. The emitters of the transistors Q3 and Q4 are connected jointly to the current source I1. Thus, the second connector of the current source I1 is connected to the ground potential.

The gain control of the second stage is carried out by the n-depletion transistors I2 and I3, which are brought into the circuit as the controllable feedback resistors of the second stage.

The gate terminals of the n-depletion transistors I2 and I3 are connected to the gain control input "V_AGC" of the transimpedance stage and are, thus, actuated by means of the amplification control voltage, which is generated outside this configuration. The drain terminal of the transistor I2 is connected to the collector of the transistor Q3; the source terminal is connected to the base of Q3; and the bulk terminal is connected to the ground potential. The drain terminal of the transistor I3 is connected to the collector of the transistor Q4; the source terminal is connected to the base of Q4; and the bulk terminal is connected to the ground potential.

Therefore, the signal "V_AGC" leads to a control operation, based on the controllable feedback resistors, between the end positions "high resistance" and "low resistance". Hence, in the "high resistance" state there is almost no feedback of the controlled differential amplifier configuration, a feature that matches a maximum gain of the input voltage of the second stage. In the "low resistance" state the gain of the stage is reduced due to a maximum feedback inside the controlled differential amplifier configuration. This gain control occurs with the simultaneous use of the internal output resistor of the first stage and guarantees that the transistors Q3 and Q4 do not move into the saturation range.

The outputs of the transimpedance stage "outp" and "outn" are connected to the collectors of the transistors Q3 and Q4. According to the invention, the feedback takes place over both stages in such a manner that the output "outn" is switched by means of the feedback elements C2 and R5 to the input "inp"; and the output "outp" is switched by means of the feedback elements C3 and R4 to the input "inn".

The aim of this circuitry is to achieve that the static offset of the transimpedance stage is transformed at the output of the stage only by a gain factor of 1.

Thus, the result is an advantageous possibility of connecting the outputs of the transimpedance stage "outn" and "outp" directly (therefore, without the second coupling capacitances 6) to the inputs of the downstream comparator, thus avoiding an additional pole position due to a capacitive offset separation.

It is desirable to design the feedback elements of the transimpedance stage for the purpose of carrying out the current-to-voltage conversion with a linear element having a low capacitance in the integrated form in order to realize a stable phase response as a function of the more critical phase frequency characteristic of the multistage amplifier, as compared to a one stage design with identical technology. Furthermore, this includes compensating the low pass portions, caused by means of the integrated transimpedance resistors R4 and R5, in the feedback by means of the high pass capacitances C2 and C3, which are also connected into the feedback.

In order to avoid a too large differential output voltage at the outputs "outn" and "outp" of the transimpedance stage, an output signal limit circuit, comprising the elements M0, M1, R6 and R7, is arranged, according to the drawing in FIG. 2, between the outputs. By means of said output signal limit circuit the differential output voltage is limited to a magnitude of less than or equal to 400 mV.

Figure 3:
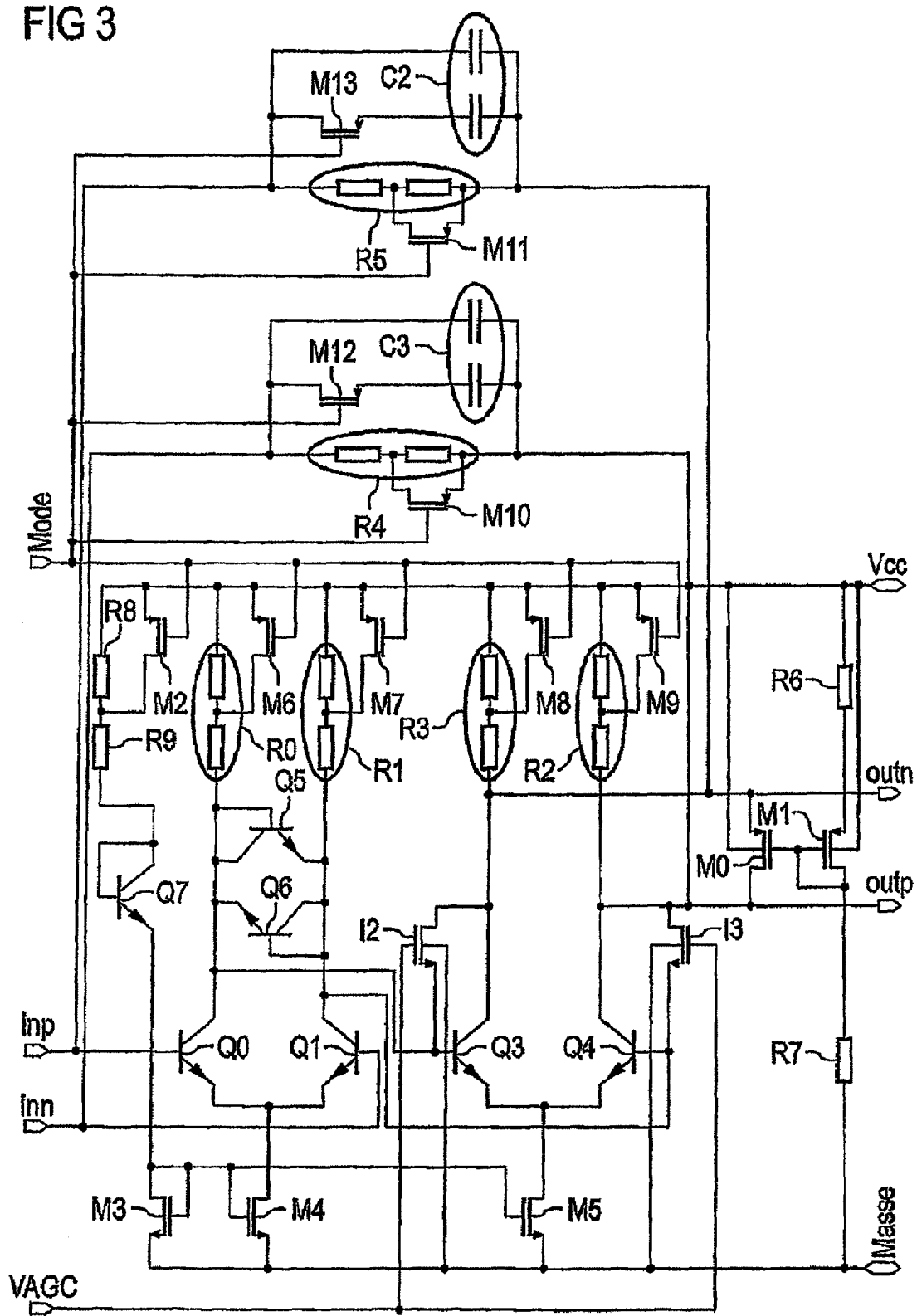
FIG. 3 depicts an inventive transimpedance stage for the IrDA protocols SIR and MIR.

A second embodiment is shown in FIG. 3. This example is based on the transimpedance stage that has already been explained in connection with the first embodiment. In order to realize a shift between the IrDA protocols SIR and MIR, the transimpedance stage exhibits a mode input.

The current sources I0 and I1 are realized by means of the circuitry in such a manner that the resistors R8, R9, the transistor Q7 and an element, realizing the input transistor M3 of the current source, are connected together in series between the operating voltage and the ground potential. The current source I0 is realized by means of the MOSFET transistor M4; and the current source I1 is realized by means of the MOSFET transistor M5. At the same time a drain source path of a MOSFET transistor M2 is connected together in parallel to the resistor R8. The gate terminal of the MOSFET transistor M2 is connected to the mode input of the configuration. Thus, owing to the control signal at the mode input as a function of the IrDA protocol that is used (SIR or MIR), the resistor R8 can be totally active if M2 is blocked in the series connection; or said resistor can be inactive, if M2 is switched on, and, thus, can change in this manner the current from the current source.

In the second embodiment the collector resistors R0, R1, R3 and R2 are designed as pairs of component resistors that are connected together in series. In this case one of the component resistors is bridged by R0, R1, R3 and R2 by means of a MOSFET transistor M6, M7, M8 and M9. The gate terminals of the MOSFET transistors M6, M7, M8 and M9 are connected to the mode input. Therefore, the resulting resistance value of the collector resistors can be changed as a function of the IrDA protocol that is used (SIR or MIR).

Even the active elements of the inventive feedback, which are controlled by means of the mode signal, are adapted to the respective IrDA protocol. To this end, for example, a series connection, comprising a component capacitance of C2 and a MOSFET transistor M13, which is controlled by means of the mode signal, are connected in parallel to the capacitance C2 from FIG. 2. Therefore, if the MOSFET transistor M13 is blocked, the active capacitance of the feedback ensues only from one component capacitance. If the MOSFET transistor M13 is switched through, the active capacitance of the feedback ensues from the parallel connection of both component capacitances. The second element of this feedback, which consists, according to FIG. 2, of the resistor R5, is carried out by means of a series connection of two component resistors. Therefore, a component resistor in turn is or is not active owing to the drain source path of a MOSFET transistor M11, which is connected together in parallel to said component resistor and which is controlled by the mode signal.

These change-over possibilities are also carried out in an analogous manner in the second feedback path. In this case the MOSFET transistor M12 is connected together in series to a component capacitance of C3; and the MOSFET transistor M10 is connected together in parallel to a component resistor of R4.

The output signal limit circuit, comprising the elements M0, M1, R6 and R7, is arranged in turn between the outputs "outn" and "oup".

The invention claimed is:

1. Configuration for carrying out a current-to-voltage conversion, preferably for an infrared receiver, comprising a multistage transimpedance stage, which has two inputs with preceding first coupling capacitances and two outputs; the outputs of the transimpedance stage being connected to inputs of a configuration for gain control; and an output of the configuration for gain control being connected to a gain control input of the transimpedance stage; the outputs of the transimpedance stage being connected to an associated input of a downstream comparator, and outputs of a second stage are fed back to inputs of a first stage of the multistage transimpedance stage.

2. Configuration, as claimed in claim 1, wherein the outputs of the multistage transimpedance stage are connected directly to the inputs of the downstream comparator.

3. Configuration, as claimed in claim 1, wherein a stage, which limits an output signal to a threshold value, is arranged between the outputs of the transimpedance stage.

* * * * *